US007846819B2

(12) United States Patent
Pribat et al.

(10) Patent No.: US 7,846,819 B2
(45) Date of Patent: Dec. 7, 2010

(54) METHOD OF SYNTHESIZING NANOSCALE FILAMENTARY STRUCTURES, AND ELECTRONIC COMPONENTS COMPRISING SUCH STRUCTURES

(75) Inventors: Didier Pribat, Sevres (FR); Jean-Eric Wegrowe, Paris (FR); Travis Wade, Paris (FR)

(73) Assignees: Centre National de la Recherche Scientifique (CNRS), Paris Cedex (FR); Ecole Polytechnique, Palaiseau Cedex (FR)

( * ) Notice: Subject to any disclaimer, the term of this patent is extended or adjusted under 35 U.S.C. 154(b) by 789 days.

(21) Appl. No.: 10/574,186

(22) PCT Filed: Oct. 12, 2004

(86) PCT No.: PCT/FR2004/002584

§ 371 (c)(1),
(2), (4) Date: Mar. 30, 2006

(87) PCT Pub. No.: WO2005/037710

PCT Pub. Date: Apr. 28, 2005

(65) Prior Publication Data

US 2006/0292870 A1    Dec. 28, 2006

(30) Foreign Application Priority Data

Oct. 13, 2003    (FR) .................................. 03 11959

(51) Int. Cl.
*H01L 21/365*    (2006.01)
*H01L 29/04*    (2006.01)

(52) U.S. Cl. .............................. 438/479; 257/E21.463; 977/742; 977/762; 977/843

(58) Field of Classification Search ................ 977/843, 977/893, 932, 936, 937, 938, 842; 423/447.5
See application file for complete search history.

(56) References Cited

U.S. PATENT DOCUMENTS 4,784,973 A * 11/1988 Stevens et al. .............. 438/653
5,314,569 A     5/1994 Pribat et al.

(Continued)

FOREIGN PATENT DOCUMENTS

CN    1278024 A  *  12/2000

(Continued)

OTHER PUBLICATIONS

Kok-Keong Lew and Joan M. Redwing; "Growth characteristics of silicon nanowires synthesized by vapor-liquid-solid growth in nanoporous alumina templates"; Jul. 2003; Journal of Crystal Growth, vol. 254, pp. 14-22.*

(Continued)

*Primary Examiner*—Stephen W Smoot
(74) *Attorney, Agent, or Firm*—Miller, Matthias & Hull (57) ABSTRACT

A method of synthesizing electronic components incorporating nanoscale filamentary structures in which method a metallic catalyst is deposited in a nanoporous membrane, the catalyst being adapted to penetrate in at least some of the pores of the nanoporous membrane, and filamentary structures are grown on the catalyst in at least some of the pores in the nanoporous membrane. The nanoporous membrane is prepared in a manner suitable for ensuring that the wall of the pores include a single-crystal zone, and at least part of the catalyst is grown epitaxially on said single-crystal zone.

24 Claims, 8 Drawing Sheets

U.S. PATENT DOCUMENTS

| | | | |
|---|---|---|---|
| 6,129,901 A * | 10/2000 | Moskovits et al. | 423/447.3 |
| 6,346,189 B1 | 2/2002 | Dai et al. | |
| 6,605,535 B1 * | 8/2003 | Lee et al. | 438/684 |
| 6,628,053 B1 * | 9/2003 | Den et al. | 313/310 |
| 6,855,603 B2 * | 2/2005 | Choi et al. | 438/268 |
| 7,323,218 B2 * | 1/2008 | Chen et al. | 427/181 |
| 2001/0028872 A1 * | 10/2001 | Iwasaki et al. | 423/447.3 |
| 2002/0136681 A1 | 9/2002 | Thess Andreas et al. | |
| 2002/0158342 A1 * | 10/2002 | Tuominen et al. | 257/784 |
| 2002/0192141 A1 * | 12/2002 | Little | 423/447.1 |
| 2003/0010971 A1 * | 1/2003 | Zhang et al. | 257/15 |
| 2004/0232426 A1 * | 11/2004 | Graham et al. | 257/77 |
| 2005/0255581 A1 * | 11/2005 | Kim et al. | 435/287.2 |
| 2005/0276743 A1 * | 12/2005 | Lacombe et al. | 423/447.3 |

FOREIGN PATENT DOCUMENTS

| | | | |
|---|---|---|---|
| FR | 2 658 839 A1 | | 9/1991 |
| WO | WO02/092506 A1 * | | 11/2002 |

OTHER PUBLICATIONS

Hideki Masuda and Masahire Satoh; "Fabrication of Gold Nanodot Array Using Anodic Porous Alumina as an Evaporation Mask"; Jan. 1996; Jpn. J. Appl. Phys., vol. 35, pp. L126-L129.*

H. Nakano, K. Nakahara, S.Kawano, S. Oue, T. Akiyama, and H. Fukushima; "Effect of electrolysis factors on crystal orientation and morphology of electrodeposited cobalt"; 2002; Journal of Applied Elecrochemistry, vol. 32, pp. 43-48.*

J. Li, C. Papadopoulos, J. M. Xu, and M. Moskovits; "Highly-ordered carbon nanotube arrays for electronics applications"; Jul. 1999; Applied Physics Letters, vol. 75, No. 3, pp. 367-369.*

R.S. Wagner and W.C. Ellis; "Vapor-Liquid-Solid Mechanism of Single Crystal Growth"; Mar. 1964; Applied Physics Letters, vol. 4, No. 5, pp. 89-90.*

Wu et al., "Block-by-Block Growth of Single-Crystalline Si/SiGe Superlattice Nanowires," Nano Letters, vol. 2, No. 2, pp. 83-86, (2002).

Kornelius Nielsch et al., "Uniform Nickel Deposition into Ordered Alumina Pores by Pulsed Electrodeposition," Advanced Materials, vol. 12, No. 8, pp. 582-586, (2000).

Kornelius Nielsch et al., "High Density Hexagonal Nickel Nanowire Array," Journal of Magnetism and Magnetic Materials, 249, pp. 234-240, (2002).

M. Kleinert et al., "Co Deposition on Au(111) and Au(100) electrodes: an in situ STM study," Electrochimica Acta, 46, pp. 3129-3136, (2001).

P. Evans, "Electrodeposition of Epitaxial Nickel Films on GaAs," Journal of Magnetism and Magnetic Materials, 260, pp. 467-472, (2003).

X. Hoffer et al., "Spin-Dependent Magnetoresistance and Spin-Charge Separation in Multiwall Carbon Nanotubes," arXiv:cond-mat/0303314v2, 3 pages, (2003).

Preliminary French Search Report FR 0311959; report dated Jul. 30, 2004.

International Search Report PCT/FR2004/002584; report dated Mar. 22, 2005.

Sui et al., "Structure Thermal Stability, and Deformation of Multibranched Carbon Nanotubes Synthesized by CVD in the AAO Template," Journal of Physical Chemistry, vol. 105, No. 8, pp. 1523-1527, (2001).

Knutson et al., "Reactivity of Surfaces and Imaging with Functional NSOM," Electrochimica Acta, vol. 48, No. 20-22, pp. 3229-3237, (2003).

* cited by examiner

Si
SiGe
Au
Au-Si(Ge)alloy

FIG.11.

METHOD OF SYNTHESIZING NANOSCALE FILAMENTARY STRUCTURES, AND ELECTRONIC COMPONENTS COMPRISING SUCH STRUCTURES

CROSS-REFERENCE TO RELATED APPLICATION

This is the U.S. National Phase of International Application No. PCT/FR2004/02584 filed 12 Oct. 2004, the entire disclosure of which is incorporated herein by reference.

FIELD OF THE INVENTION

The invention relates to the field of methods of synthesizing nanoscale filamentary structures and of electronic components comprising such structures.

BACKGROUND OF THE INVENTION

The document "Spin-dependent magnetoresistance and spin-charge separation in multiwall carbon nanotubes" by X. Hoffer et al., discloses a method of synthesizing electronic components incorporating nanoscale filamentary structures.

The term "nanoscale filamentary structures" is used throughout the present document to designate nanoscale structures that form wires, rods, tubes, etc., i.e. structures that extend essentially in one direction.

In the above-mentioned document, the nanoscale filamentary structures are carbon nanotubes. The method of synthesizing those carbon nanotubes as described in the above-mentioned article by X. Hoffer et al., comprises the operations consisting in:
  depositing, in a nanoporous membrane, a metal catalyst suitable for penetrating into at least some of the pores of the nanoporous membrane; and
  causing filamentary structures to grow on the catalyst in at least some of the pores in the nanoporous membrane.

In that article by X. Hoffer et al., the resulting carbon nanotubes may be semiconductive or metallic. This lack of determinism is associated in particular with the fact that there is no control over the chirality of the nanotubes while they are being synthesized. This constitutes a major obstacle to making use of carbon nanotubes in electronic applications.

An object of the invention is to provide a method of synthesizing nanoscale filamentary structures that makes it possible to achieve better control simultaneously over their position, their size, and their orientation, and in particular the orientation of the structures relative to one another.

To achieve this object, the invention provides a method of synthesizing nanoscale filamentary structures which, in addition to comprising the above-mentioned operations, is characterized by the fact that it further comprises the operations of preparing the nanoporous membrane in a manner suitable for ensuring that the wall of the pores includes a single-crystal zone, and growing at least some of the catalyst epitaxially on said single-crystal zone.

By means of the invention, the nanoscale filamentary structures grow in the pores of the nanoporous membrane. It is thus possible to control the density, the diameter, the length, and the orientation of filamentary nanoscale structures. In addition, the texturing, orientation, and crystallization of the metallic catalyst, given that it is grown at least in part epitaxially on a material element common to numerous pores, enables the orientation of the nanoscale filamentary structures to be controlled relative to one another. When the nanoscale filamentary structures are constituted by carbon nanotubes, this serves to control the chirality of the nanotubes.

In the present document, the concept of "epitaxial growth" covers the following three properties: texturing, orientation, and crystallization.

The method of the invention may further comprise one or more of the following dispositions:
  calibrated pores are made in the nanoporous membrane;
  the nanoporous membrane is made in a manner suitable for ensuring that it extends substantially in a plane, and the pores are made in a manner suitable for ensuring they are oriented in a well-determined direction, e.g. substantially perpendicularly or parallel to the plane of the membrane;
  the single-crystal zone of the wall of the pores in the nanoporous membrane correspond to the bottom of the pores;
  the nanoporous membrane is made from a single-crystal material; e.g. the nanoporous membrane is made by anodic oxidation of a single-crystal substrate;
  the nanoporous membrane is made in a thin layer transferred or deposited onto a single-crystal substrate; under such circumstances, the thin layer may also already be a nanoporous membrane prior to being deposited or transferred on the single-crystal substrate;
  a barrier layer is made on the single-crystal substrate, prior to transferring or depositing the thin layer onto the single-crystal substrate, the material of said barrier layer forming a diffusion barrier and being suitable for preventing the catalyst, at least in part, from being contaminated by the material constituting the substrate;
  prior to growing the catalyst in at least some of the pores of the membrane, a diffusion barrier forming material is deposited that is suitable for preventing the catalyst, at least in part, from being contaminated by the material underlying it; for example the diffusion barrier may be constituted by tungsten electroplated at the bottom of the pores;
  the catalyst is deposited in at least some of the pores by electroplating;
  the catalyst is deposited in at least some of the pores by chemical gas deposition;
  the catalyst is deposited in at least some of the pores of the nanoporous membrane, and then the catalyst as deposited in this way is annealed; optionally with the annealing performed under a magnetic field;
  an electronic component is made on the nanoporous membrane;
  the nanoscale filamentary structures are carbon nanotubes;
  the filamentary structures are deposited by chemical vapor deposition; as the catalyst for growing carbon nanotubes, it is possible to use a transition metal, possibly in association with a rare earth; under such circumstances, the catalyst is essentially a substance that dissolves carbon well; for example it may be iron, cobalt, nickel, platinum, etc.; it may also be a substance made up of at least two of those ingredients; and
  the nanoscale filamentary structures are nanowires or nanorods; and under such circumstances, the catalyst is optionally a metal from the list comprising gold and aluminum.

In another aspect, the invention provides a component for electronics including at least one nanoscale filamentary structure obtained by the method according to any preceding claim, the component comprising:
  a nanoporous membrane in which the pores include a single-crystal zone; and a metallic catalyst deposited in at least some of the pores of the nanoporous membrane, at least part of the catalyst being grown epitaxially on the single-crystal zone of the nanoporous membrane.

The component may include at least a portion of the nanoporous membrane that constitutes an electrode thus making it possible to impose a voltage to at least one nanoscale filamentary structure deposited in another portion of the nanoporous membrane.

The component of the invention may further comprise one or more of the following dispositions:
  it includes at least one filamentary nanoscale structure extending parallel to the plane of the substrate;
  it includes an electrode itself having an extension in a pore of the nanoporous membrane;
  at least one filamentary nanoscale structure is a carbon nanotube; and
  at least one filamentary nanoscale structure is a rod or a wire.

The above characteristics and others appear more clearly on reading the following description of particular embodiments of the invention given as non-limiting examples. The description refers to the accompanying drawings, in which:

Implementations of the method of the invention are described below by way of example with reference to two applications.

In the first application, the method of the invention is implemented to synthesize nanoscale filamentary structures in the form of carbon nanotubes.

Figure 1:
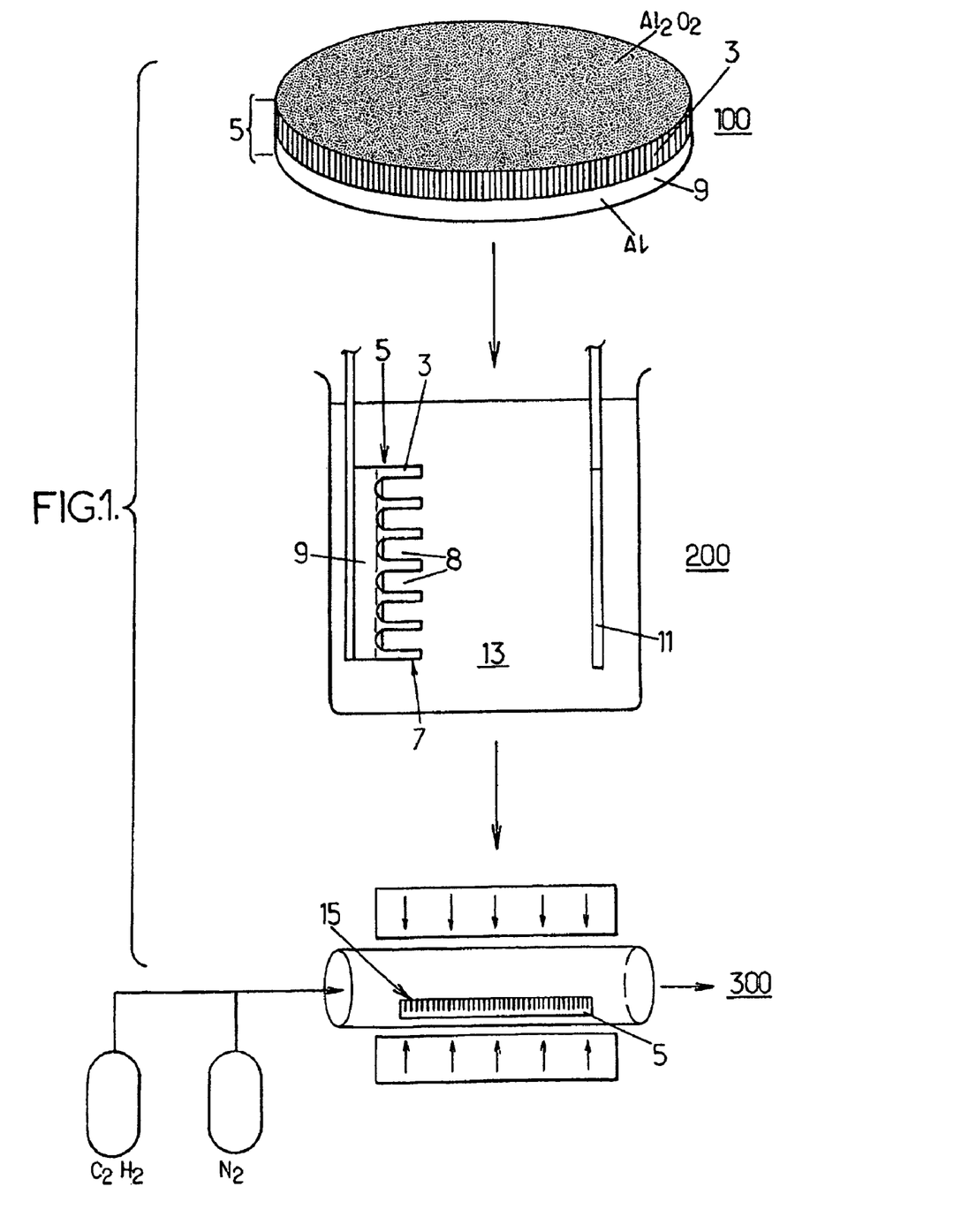
FIG. 1 is a diagram showing an example of an implementation of the method of the invention, for synthesizing carbon nanotubes.

FIG. 1 shows a non-limiting example of an implementation of the method of the invention associated with this first application.

In this example, the method comprises:
  a step 100 of making a nanoporous membrane 3 by anodizing an aluminum substrate 5, wherein the substrate 5 retains an aluminum layer 9 disposed under the membrane 3;
  a step 200 of electroplating a transition metal (Ni, Cr, Co, Fe, etc.) or platinum, one or the other possibly being lightly alloyed with a rare earth (Y, Ce, etc.), so as to form a catalyst 7 in the nanoporous membrane 3 obtained in the preceding step (the catalyst 7 is an element or a chemical compound that is suitable for dissolving a large amount of carbon); and
  a step 300 of depositing carbon in the pores 8 of the nanoporous membrane 3 by chemical vapor deposition (CVD).

The aluminum anodizing technique for obtaining nanoporous membranes and as implemented in step 100 is well known [see for example the article by Nielsch et al., Adv. Mater. 12, 582 (2000), or J. Magn. Magn. Mat. 249, 234 (2002)]. That technique has numerous advantages: it is easy to implement (using only a conventional potentiostat), alumina ($Al_2O_3$) is obtained which is a material that is remarkable from the point of view of its ability to withstand high temperatures and from the point of view of its dielectric properties, etc.

That technique makes it possible in the laboratory to provide nanoporous membranes 3 having an array of pores 8 of diameter lying in the range 5 nanometers (nm) to 100 nm, with a length lying in the range 0.5 micrometers ($\mu$m) to 50 $\mu$m. Typically, for pores having a diameter of 60 nm, pore density is of the order of $10^{10}$ pores per square centimeter ($cm^2$).

In this example, the substrate 5 is constituted by an aluminum single crystal.

To obtain carbon nanotubes having a small number of sheets, or even a single sheet, nanoporous membranes 3 are made with pores 8 having a diameter of about 5 nm, or less, and a length shorter than one micrometer. In order to make electronic components, it is desirable to reduce pore density.

It should be observed that the chirality of carbon nanotubes is conserved so long as the number of sheets remains less than about five, which means that it is necessary to obtain nanopores having a diameter in the range 5 nm to 7 nm in order to obtain nanotubes of determined chirality, thus ensuring that the resulting carbon nanotubes are correspondingly more advantageous for applications in electronics.

It should also be observed that for applications in electronics, the aluminum substrate 5 is anodized in order to form the nanoporous membrane 3, advantageously while using a mask in order to define nano-structured zones having carbon nanotubes, and zones that are more specifically dedicated to making electrical connections.

The step 200 of electroplating the catalyst is performed by applying a potential between the aluminum 9 situated under the nanoporous membrane 3 and a counter-electrode 11 in an electrolytic bath 13. The step 200 of electroplating the catalyst is performed by adjusting the electrolytic growth parameters (deposition potential, concentration of catalyst in the bath, bath pH, frequency of the deposition alternating potential, etc.). It is then possible to obtain single crystals of the catalyst. The presence of the aluminum single crystal of the substrate 5 prior to anodization makes it possible, to some extent, to initiate epitaxial growth during electroplating.

The influence of the crystal structure of the substrate 5 on the crystal structure of the metals or semiconductors that are electroplated on such a substrate 5 has been demonstrated. For example, in the document by M. K. Kleinert et al., Electrochemica Acta, 46 (2001) 3129, cobalt electroplated on gold (Au[100]) acquires a regular structure reflecting the symmetry of the substrate 5. In the document by P. Evanes et al., JMMM 260 (2003), 467, nickel electroplated on a gallium arsenide substrate continues to grow epitaxially over a thickness of 10 nm to 120 nm.

The catalyst may optionally be electroplated after reducing oxide residues which are formed during the step 100 of anodizing the aluminum single crystal of the substrate 5, that is performed in order to obtain the nanoporous membrane 3. Prior calibration makes it possible to control the number of catalyst atoms that are deposited in each pore.

Electroplating is a deposition technique that is fast and enables the catalyst 7 to be deposited at the bottom of the pores 8 while conserving a deposited material that is well textured.

Also optionally, electroplating may be performed under a magnetic field in order to encourage obtaining an axis of easy magnetization and thus act on controlling chirality, during subsequent growth of carbon nanotubes.

After the step 200 of electroplating the catalyst, the method of the invention optionally includes an annealing step at a temperature of about 500° C. to 630° C., or even less.

By having a catalyst that is held captive in the pores 8 of the nanoporous membrane 3, after electroplating, instead of having a catalyst in the form of small particles on the surface of a substrate, it becomes possible to perform crystallization/epitaxy annealing at medium temperature, while avoiding surface diffusion which would encourage the catalyst to coalesce.

The method of the invention thus makes it possible simultaneously to maintain the nanoscale size of the catalyst and to structure it during deposition and/or by annealing.

The step 300 of depositing carbon and of growing carbon nanotubes 15 is performed by chemical vapor deposition at a slow speed of growth. This type of technique provides better control over the crystal quality of carbon nanotubes 15. In particular, plasma-assisted chemical vapor deposition in electron cyclotron resonance condition makes it possible to work at low pressure and thus to obtain good control over the speed of deposition.

Typically carbon nanotubes are deposited by using acetylene as the precursor gas, with the temperature during deposition being set to about 620° C.

It is also possible to eliminate aluminum after the anodizing step 100 and the electroplating step 200. Thus, the temperature, in particular while growing carbon nanotubes, can be raised to higher than 650° C. This can also be achieved by alloying the aluminum with a metal that is more refractory by performing deposition and diffusion after the anodizing and electroplating.

Figures 2, 3, 4, 5:
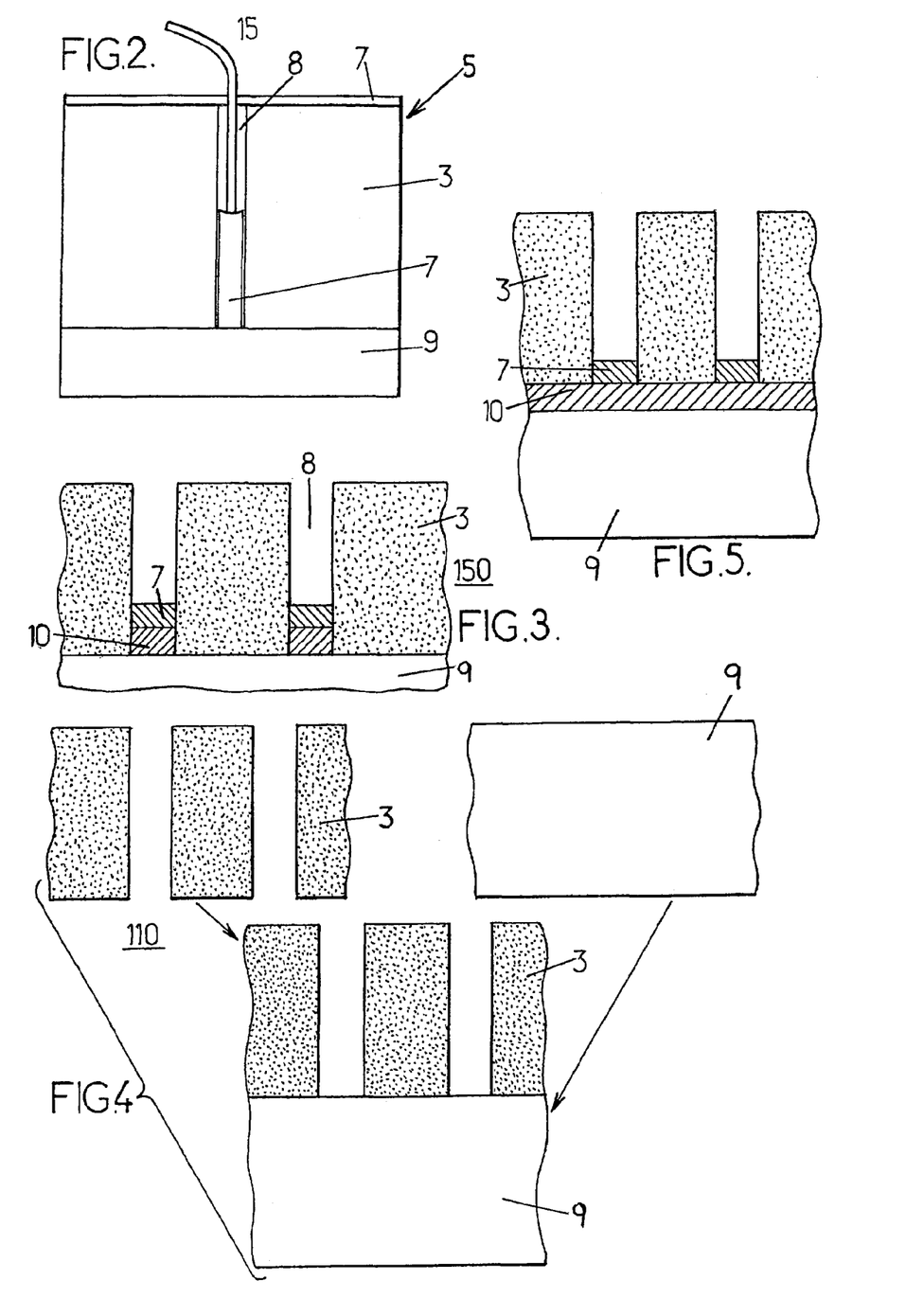
FIG. 2 is a diagram of a pore including a carbon nanotube obtained by the method shown in FIG. 1.
FIG. 3 is a diagram in section of a nanoporous membrane in which the pores are covered at least in part by a barrier layer on which a catalyst is deposited.
FIG. 4 is a diagram showing a nanoporous membrane being transferred onto a substrate, in accordance with a variant of the method of the invention.
FIG. 5 is a diagram in section showing a variant of the structure shown in FIG. 3, in which the barrier layer is deposited on a substrate prior to transferring a nanoporous membrane in application of the operations shown diagrammatically in FIG. 4.

The carbon nanotubes 15 that are obtained at the end of the method of the invention as described above are oriented because their growth is catalyzed by the catalyst 7 which itself is epitaxially grown on the single-crystal material of the substrate 5 and the nanoporous layer 3 (see FIG. 2). The chirality of the nanotubes is thus well determined.

Naturally, the implementation of the method of the invention as described above can be subjected to numerous variations.

In one variant, shown in FIG. 3, a step 150 of depositing a barrier layer 10 is performed between the anodizing step 100 and the step 200 of electroplating the catalyst 7. This barrier layer 10 is for preventing the catalyst 7 being contaminated by elements diffusing from the aluminum layer 9, in particular when making use of an annealing step in order to encourage epitaxial growth of the catalyst 7 at the bottom of the pores 8. By way of example, the barrier layer 10 may be constituted by electroplated tungsten.

In another variant shown in FIG. 4, a nanoporous membrane 3 is formed during a step 100 of anodizing, over the entire thickness of a layer of aluminum. Thereafter the nanoporous membrane is transferred during a step 110 on an aluminum layer 9, or more generally on a single-crystal metallic substrate.

In yet another variant, shown in FIG. 5, a step 160 of electroplating a barrier layer 10 on an aluminum layer 9, or more generally a single-crystal metallic substrate, is performed, before transferring onto the layer 9 a nanoporous membrane 3 that is anodized throughout its thickness during a step 110 as mentioned above, the membrane being transferred on the side where the barrier layer 10 has previously been deposited. The catalyst 7 is then deposited during a step 200, as mentioned above.

In addition, materials other than alumina can be obtained for the nanoporous membrane 3. It is also possible to make the alumina of the nanoporous membrane 3 from a layer of aluminum grown epitaxially on an insulating substrate such as aluminum nitride (AlN, itself possibly grown epitaxially on silicon), sapphire, magnesium oxide (MgO), etc.

Similarly, the intended purpose depends on the orientation selected for the substrate, i.e. the chirality that it is desired to obtain for the carbon nanotubes.

In addition, the way in which the carbon nanotubes are deposited can be subjected to numerous variations. Thus, it is possible to obtain carbon nanotubes of good crystal quality using chemical vapor deposition by means of a hot filament. The precursor gas may be methane or any other carbon-containing gas known to the person skilled in the art. It is also possible to vary the deposition temperature, with temperature being optimized in particular as a function of the catalyst that is used.

One of the major advantages of the method of the invention relies on the fact that carbon nanotubes are grown in controlled manner from catalyst nanocrystals that are all identical in size and in orientation, within pores of calibrated size, thereby obtaining nanotubes that are likewise identical, in particular from the point of view of their diameter and their chirality.

Controlling the shape and the properties, and in particular the chirality, of carbon nanotubes by using the method of the invention makes it possible in reproducible manner to fabricate components for electronics (transistors, light-emitting diodes (LEDs), sensors, actuators, etc.). An example of an electronic component in accordance with the present invention is described below with reference to FIG. 6. It comprises a field-effect transistor (FET) 50.

Figure 6:
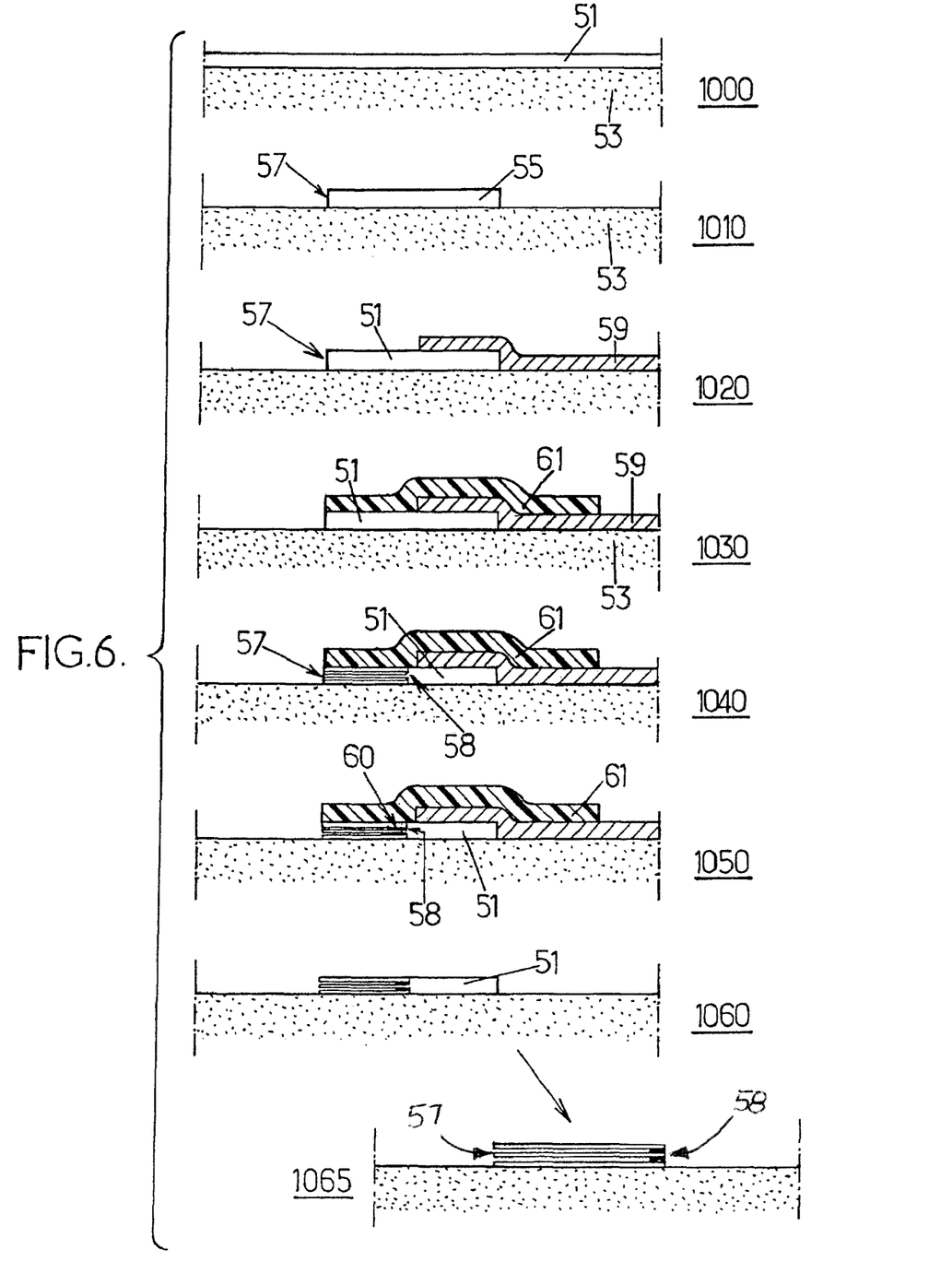
FIG. 6 is a diagram showing an example of an implementation of the method of the invention for fabricating a component in accordance with the invention.

The FET 50 is made by implementing the following steps:
a step 1000 of epitaxially growing an aluminum layer 51 on a single-crystal insulating substrate 53 (AlN, sapphire, MgO, etc.); optionally the single-crystal substrate 53 is replaced by a thin insulating layer (of AlN, sapphire, MgO, etc.) grown epitaxially on a substrate such as silicon, which is itself a single crystal and adapted for epitaxially growing the thin layer;
a step 1010 of etching strips 55 that are etched in the thickness of the aluminum layer 51; the orientation of these strips 55 in the plane of the substrate 53 is selected so as to encourage a particular lateral orientation of the aluminum flanks 57 so as to optimize epitaxial growth of catalyst nanocrystals by electroplating;

a step 1020 of depositing an electrode 59 on the epitaxially-grown aluminum layer 51; this electrode 59 is necessary for the subsequent anodic oxidation and electroplating;

a step 1030 of encapsulating the assembly constituted by the epitaxially-grown aluminum layer 51 and its electrode 59 in an insulating material 61 such as a polymer or silica, or any other insulating thin layer; the insulating material 61 is needed to insulate the top of the epitaxially-grown aluminum layer 51 and its electrode 59 from the electrolytic solution used for the subsequent anodic oxidation and electroplating;

a step 1040 of anodic oxidation of the flank 57 of the epitaxially-grown aluminum layer 51 that is not protected by the encapsulating insulating material 61; this step is performed by implementing the above-described step 100; it gives rise to the formation of an $Al_2O_3/Al$ interface 58;

a step 1050 of electroplating a catalyst 60 at the interface 58, this step likewise being performed in the same manner as the above-described operation 200;

a step 1060 of eliminating the encapsulating layer of insulating material 61 and the electrode 59;

an optional step 1065 of eliminating the aluminum 51, in particular if it is desired subsequently to grow carbon nanotubes 63 at a temperature higher than 650° C.;

a step 1070 of growing carbon nanotubes 63 by chemical vapor deposition, by implementing the above-described operation 300;

a step 1080 of making islands 65 in the strips 55, now constituted by alumina formed by oxidizing the epitaxially-grown aluminum (some aluminum 51 may possibly remain); these strips 55 have at least one flank 57 provided with carbon nanotubes 63; optionally, the alumina is then etched again so that the carbon nanotubes 63 project from the flanks 57;

a step 1090 of depositing a metal 67, typically titanium, so as to establish ohmic contact on the drain side (on the epitaxially-grown aluminum layer 51 or with the flush carbon nanotubes 63), and on the source side (with the flush carbon nanotubes 63 on the flank 57);

a step 1100 of etching a channel 69;

a step 1110 of depositing a thin insulating layer 71, typically of $SiO_2$, or some other material having a greater dielectric constant such as $TiO_2$; and a step 1120 of depositing and etching a gate 73 so that it overlaps a little over the source and drain electrodes 67*a* and 67*b*.

The above-described method of making the FET 50 can be subjected to numerous variations.

Figure 7:
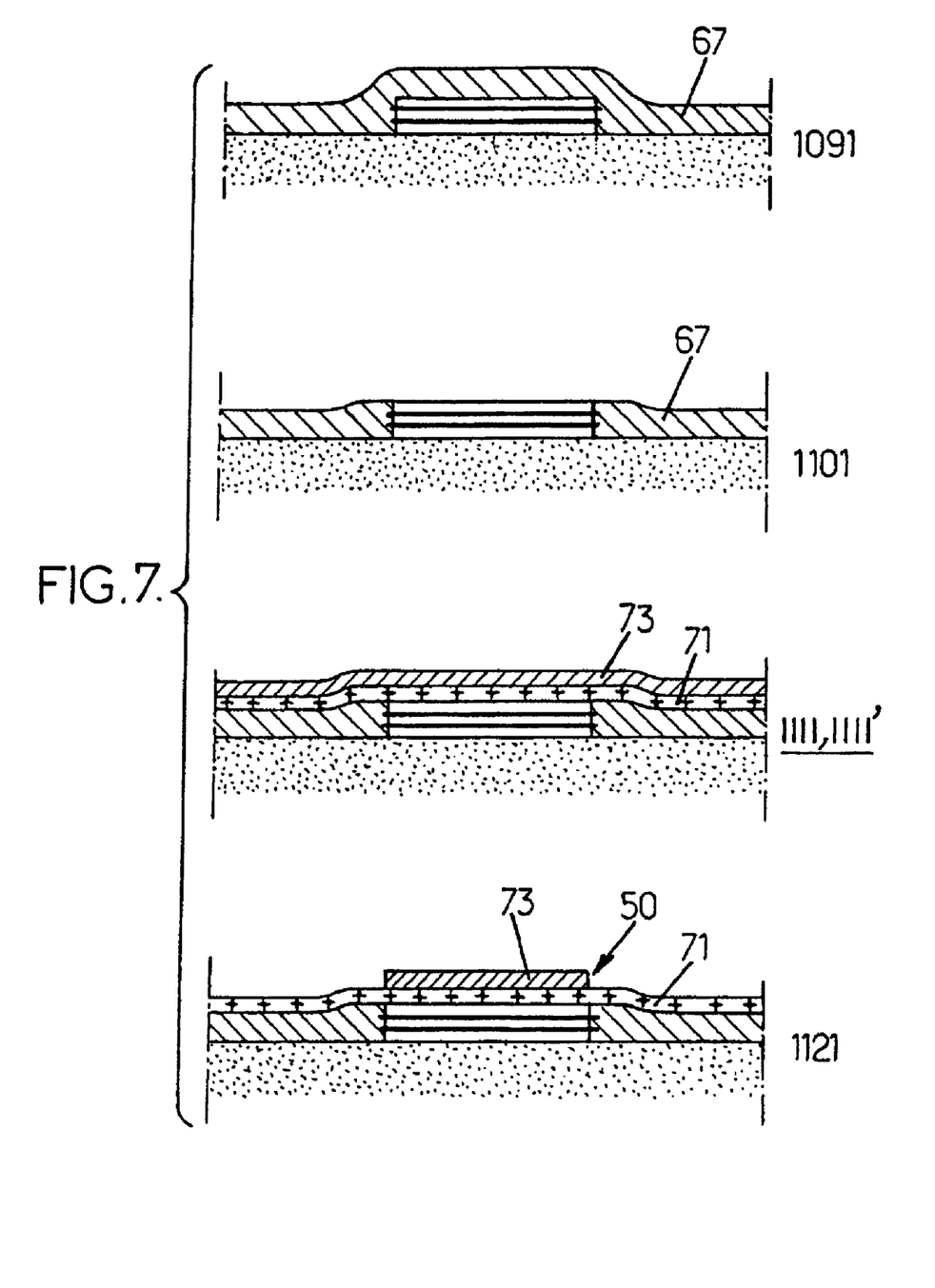
FIG. 7 is a diagram similar to FIG. 6 showing a variant of the method shown in FIG. 6.

In particular, FIG. 7 shows that it is possible to make an FET 50 by self-alignment.

For example, the steps 1090 to 1120 as described above are replaced by the following steps 1091 to 1121.

During a step 1091, a metal 67 is deposited as in the above step 1090.

During a step 1101, the layer of metal 67 is etched by planarization until the nanoporous alumina is reached. This etching is performed using a method well known to the person skilled in the art and known as chemical mechanical polishing (CMP).

Successive deposits of the thin insulating layer 71 and a layer of metal 73 are then deposited during steps 1111 and 1111.

During step 1121, the metal layer 73 is etched to form the gate of the FET 50.

Figure 8:
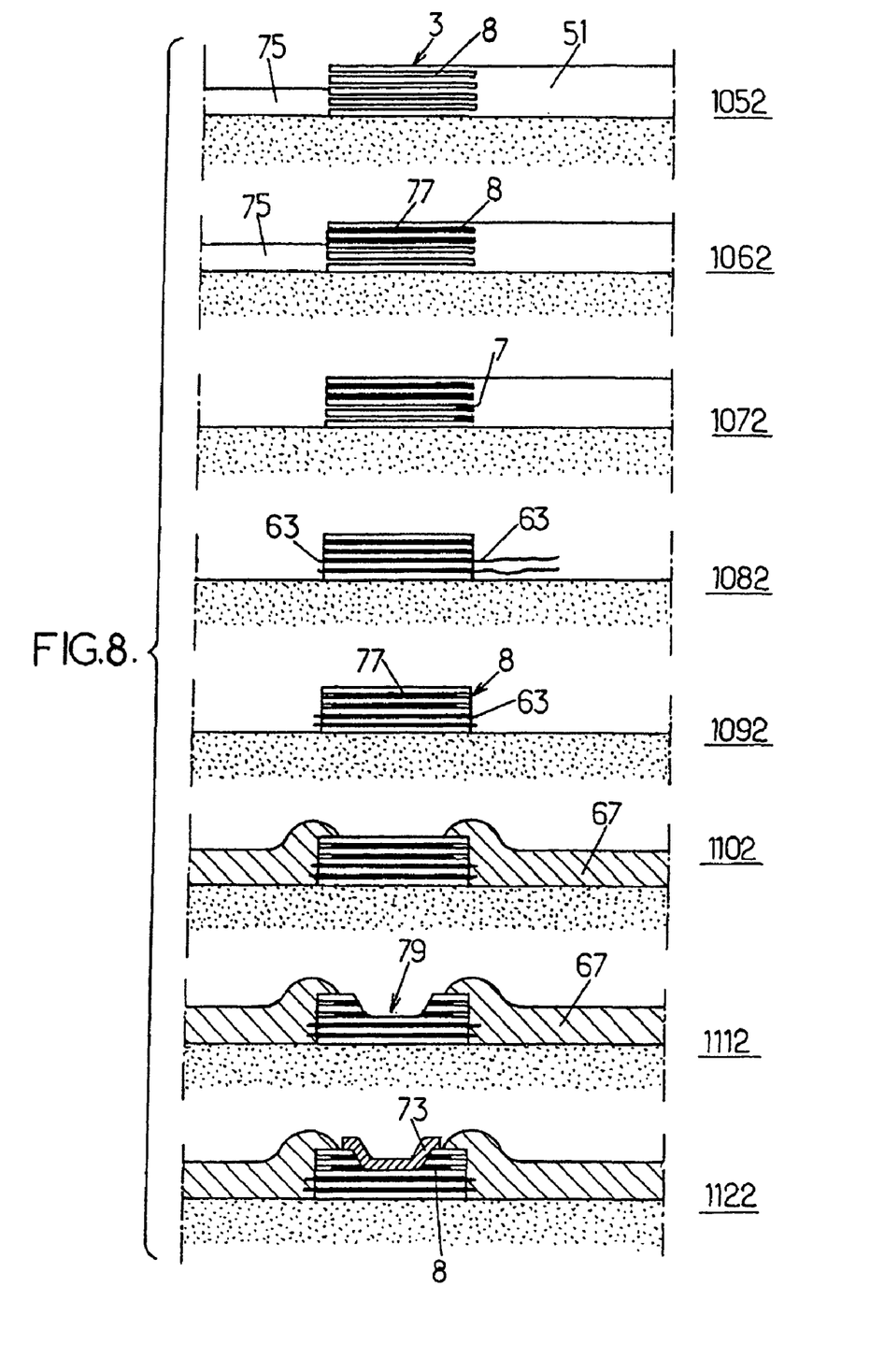
FIG. 8 is a diagram showing another variant of the method shown in FIGS. 6 and 7.

In another variant shown in FIG. 8, the steps 1050 et seq. of the implementation shown in FIG. 6 are replaced by the following steps.

During a step 1052, a resin 75 is deposited over a thickness corresponding to a fraction of the height of the nanoporous membrane 3.

During a step 1062, the surface pores 8 are filled selectively, i.e. those pores that are not protected by the resin 75, using a metal 77 that does not constitute a catalyst for growing carbon nanotubes. During a step 1072, the resin 75 is eliminated and the catalyst 7 is electroplated, e.g. in the manner specified for above-described step 1030 to 1060.

During a step 1082, the carbon nanotubes 63 are grown, e.g. as during the above-described step 1070.

During a step 1092, the carbon nanotubes 63 are etched and the metal 71 in the pores 8 is under-etched.

During a step 1102, the source and drain contacts are deposited, e.g. by depositing metal and by etching, in a manner analogous to above-described steps 1090 and 1100.

In a step 1112, a well 79 is opened in the alumina so that during a step 1122, a gate 73 can be deposited so as to make contact with the metal 77 in the pores 8.

In the second application, the method of the invention is implemented to synthesize nanoscale filamentary structures in the form of nanowires or nanorods. These structures are also known to the person skilled in the art as "whiskers" (see for example patent document FR-A-2 658 839).

Figure 9:
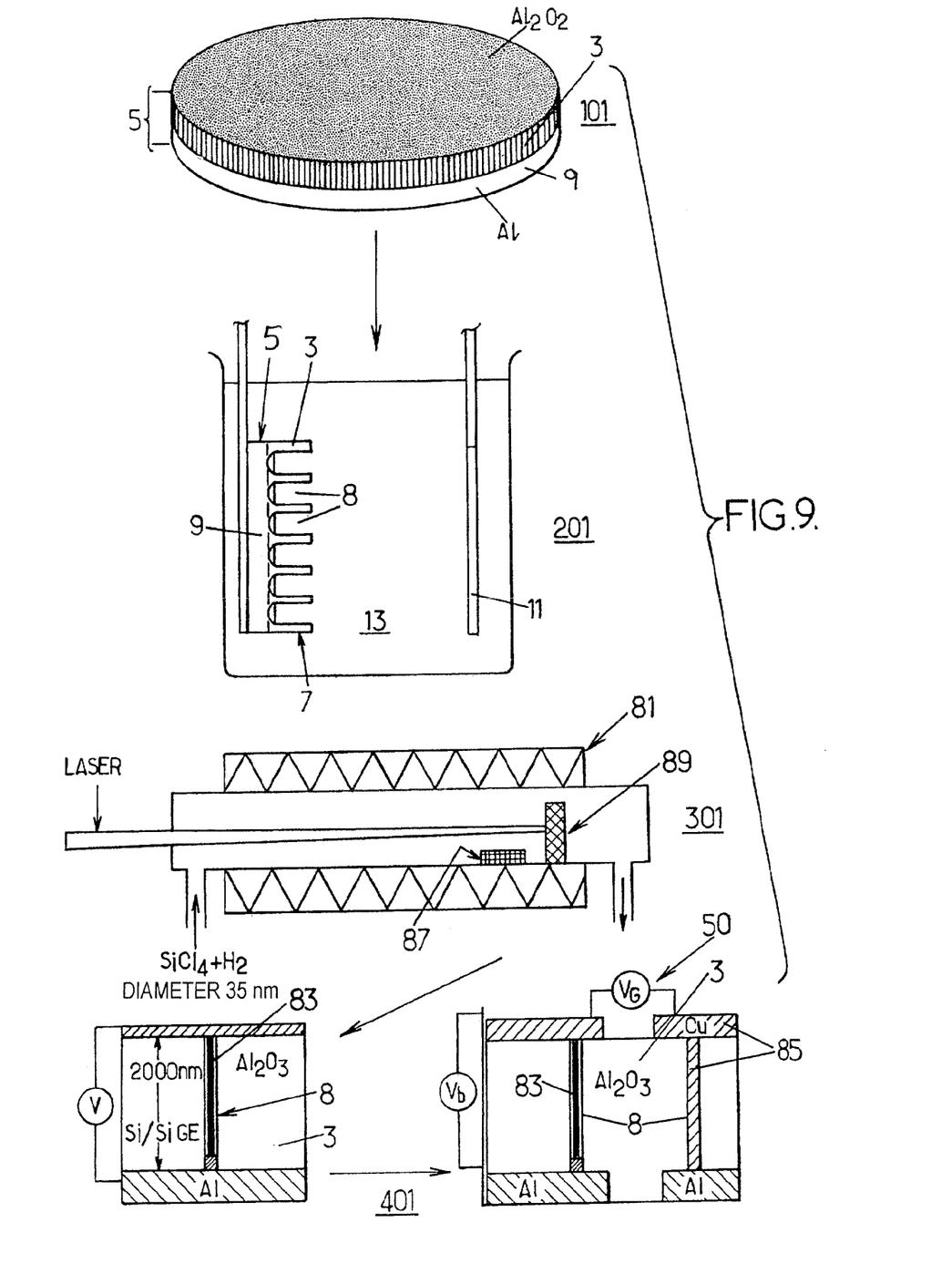
FIG. 9 is a diagram showing another example of an implementation of the method of the invention for synthesizing nanorods.

FIG. 9 shows a non-limiting example of an implementation of the method of the invention in association with this second application.

In this second application, the method comprises:

a step 101 of making a nanoporous membrane 3 by partially anodizing a single-crystal aluminum substrate 5 (or more generally a substrate of any single-crystal metal);

a step 201 of electroplating a metal such as gold to form a catalyst 7 in the nanoporous membrane 3 obtained in the preceding step; and a step 301 of growing multiple layers of silicon and germanium by chemical vapor deposition assisted by laser ablation in an oven 81 under a stream of a gaseous mixture constituted by $SiCl_4$ and $H_2$. This multilayer structure constitutes a single-crystal nanorod 83 inside a pore 8.

In addition, to make an electronic component, during a step 401, a conductive metal 85 such as copper is deposited, e.g. by electroplating, in a pore 8 adjacent to a nanorod 83 made during the step 301.

The anodization step 101 is analogous to that implemented for the first application. It naturally retains the same advantages.

The electroplating step 201 is analogous to that implemented for the first application, except that the nature of the electroplated catalyst may be different. Nevertheless it conserves the same advantages.

Figure 10:
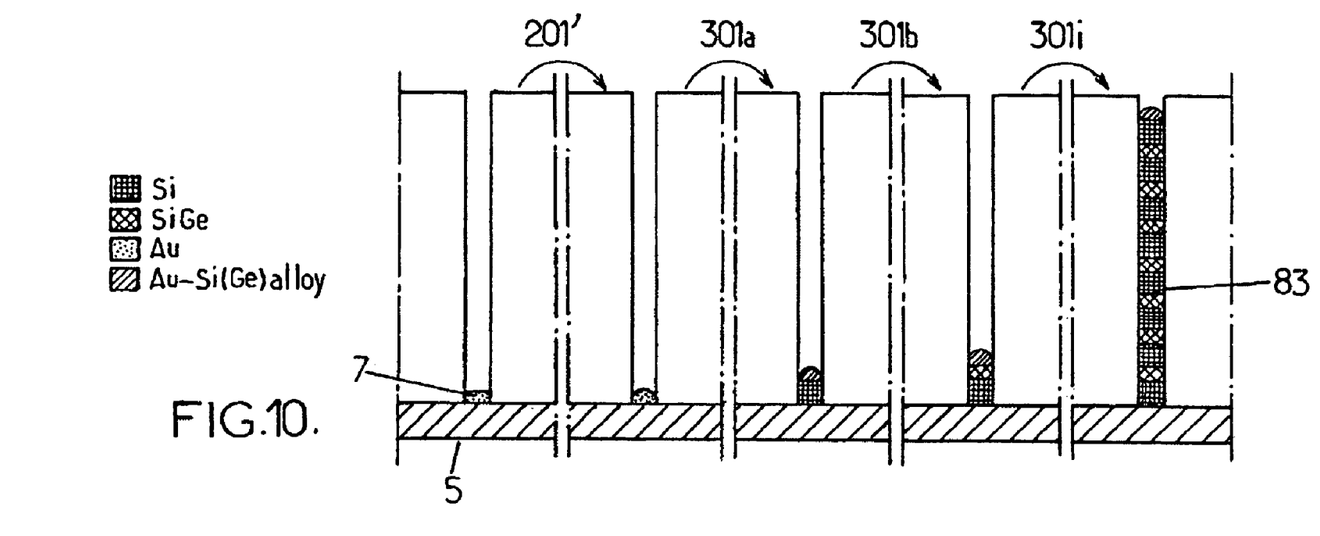
FIG. 10 is a diagrammatic section through a portion of a nanoporous membrane in which a nanorod is caused to grow during the implementation shown in FIG. 9.

As shown in FIG. 10, during a step 201', it is possible optionally to anneal the catalyst 7 that was deposited during the step 201, which enables it to be grown epitaxially on the substrate 5.

FIG. 10 further illustrates an exemplary embodiment of step 301 of growing the multilayer structure of silicon and germanium, which consists of a succession of sequences 301*a*, 301*b*, ..., 301*i* of depositing silicon, and then depositing silicon-germanium. For this purpose, a silicon crucible 87 and a germanium target 89 are placed in the oven 81. During sequences of depositing silicon and of depositing silicon-germanium, a gaseous mixture of $SiCl_4$ and of $H_2$ is swept through the oven 81 and carries the silicon and silicon-germanium vapor formed from the silicon crucible 87 and the germanium target 89. During each sequence of depositing silicon, only the silicon is vaporized. During each sequence of depositing silicon-germanium, germanium is also pulverized by laser ablation, in addition to evaporating silicon. In this variant of the method of the invention, the implementation of this growth step 301 is based on the article by Y. Wu et al., in Nanoletters 2, 83 (2002). Laser ablation serves to provide a programmable pulsed vapor source, thus enabling nanorods 83 to be grown block by block with a composition profile that is very well defined over the full height of each nanorod 83. Single-crystal nanorods 83 are thus made, e.g. having a height of 2 μm and a diameter of 35 nm, having a superlattice of Si/SiGe. Such one-dimensional heterostructures are most advantageous for applications such as light-emitting devices and thermoelectric devices.

By way of example, step 401 consists in electroplating copper in a pore adjacent to the nanorod 83 made during the step 301, e.g. by masking and microlithographic techniques (possibly electron microlithographic techniques) known to the person skilled in the art.

A structure is thus obtained in which a potential can be applied between the aluminum of the underlying substrate 5 and the copper 85 deposited on the membrane in order to form source and drain contacts of a transistor 50, while the copper in the adjacent pore forms the gate of the transistor 50.

In this second application, it is possible to make use of the same variations as can be used in the method of the invention implemented in the first application. I.e., in particular, it is possible to use a barrier layer and/or to transfer a nanoporous membrane as shown in FIGS. 3 to 5.

The above-described invention can be subjected to numerous variations. In particular, the steps of the various above-described implementations can be combined.

Figure 11:
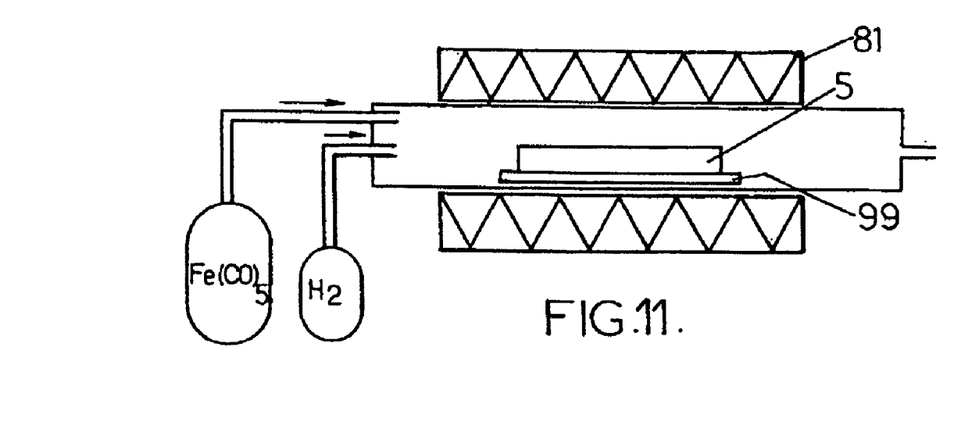
FIG. 11 is a diagram showing an oven for implementing a variant of the method of the invention.

In addition, catalyst particles can be deposited in the pores 8 of the nanoporous membrane 3 by any other means known to the person skilled in the art. For example, chemical gas deposition (CVD) can be used. In this technique, a carbonyl metal is used such as $Ni(CO)_5$ or $Fe(CO)_5$, which is decomposed in an oven 81 in which the membrane 3 is positioned on a sample carrier 99 (see FIG. 11). For example, with $Fe(CO)_5$, decomposition takes place at about 250° C. It is also possible to make use of a precursor such as dicylcopentadienyliron (ferrocene: $Fe(Cp)_2$) which decomposes at a higher temperature (≈600° C.-800° C.). The metal (e.g. Ni or Fe) then becomes deposited in the pores 8.

The invention claimed is:

1. A method of synthesizing electronic components incorporating nanoscale filamentary structures, the method comprising:
   making a nanoporous membrane having a plurality of pores in a thin layer transferred or deposited onto a single-crystal substrate;
   depositing a metal catalyst in and on the nanoporous membrane, the metal catalyst suitable for penetrating into at least some of the pores of the nanoporous membrane;
   growing filamentary structures on the catalyst in the at least some of the pores of the nanoporous membrane;
   wherein the nanoporous membrane is prepared in a manner suitable for ensuring that a wall of the pores includes a single-crystal zone, and
   wherein at least some of the catalyst is grown epitaxially on said single-crystal zone and on at least a portion of the nanoporous membrane common to numerous pores so that orientation of the nanoscale filamentary structures is controlled relative to one another and so that the chirality of the nanoscale filament structures is also controlled.

2. A method according to claim 1, in which the pores of the nanoporous membrane have a calibrated size.

3. A method according to claim 1, in which the nanoporous membrane is made in a manner suitable for ensuring that it extends substantially in a plane, and the pores are made in a manner suitable for ensuring they are oriented substantially perpendicularly to the plane of the membrane.

4. A method according to claim 1, in which the nanoporous membrane is made in a manner suitable for ensuring that it extends substantially in a plane, and the pores are made in a manner suitable for ensuring they are oriented substantially parallel to the plane of the membrane.

5. A method according to claim 1, in which the single-crystal zone of the wall of the pores in the nanoporous membrane corresponds to the bottom of the pores.

6. A method according to claim 1, in which the nanoporous membrane is made by anodic oxidation of a single-crystal substrate.

7. A method according to claim 1, in which a barrier layer is made on the single-crystal substrate, prior to transferring or depositing the thin layer onto the single-crystal substrate, the material of said barrier layer forming a diffusion barrier and being suitable for preventing the catalyst, at least in part, from being contaminated by the material constituting the substrate.

8. A method according to claim 1, in which, prior to growing the catalyst in at least some of the pores of the membrane, a diffusion barrier forming material is deposited that is suitable for preventing the catalyst, at least in part, from being contaminated by the material underlying it.

9. A method according to claim 1, in which the catalyst is deposited in at least some of the pores by electroplating.

10. A method according to claim 1, in which the catalyst is deposited in at least some of the pores by chemical gas deposition.

11. A method according to claim 1, in which the catalyst is deposited in at least some of the pores of the nanoporous membrane, and then the catalyst as deposited in this way is annealed.

12. A method according to claim 11, in which annealing is performed under a magnetic field.

13. A method according to claim 1, in which an electronic component is made on the nanoporous membrane.

14. A method according to claim 1, in which the nanoscale filamentary structures are carbon nanotubes.

15. A method according to claim 14, in which the catalyst comprises a transition metal.

16. A method according to claim 1, in which the filamentary structures are deposited by chemical vapor deposition.

17. A method according to claim 1, in which the nanoscale filamentary structures are nanowires or nanorods.

18. A method according to claim 17, in which the catalyst is a metal from the list comprising gold and aluminum.

19. A component for electronics including at least one nanoscale filamentary structure obtained by the method according to claim 1, the component comprising:
   a nanoporous membrane in which the pores include a single-crystal zone; and
   a metallic catalyst deposited in at least some of the pores of the nanoporous membrane, at least part of the catalyst being grown epitaxially on the single-crystal zone of the nanoporous membrane.

20. A component according to claim 19, in which at least a portion of the nanoporous membrane constitutes an electrode enabling a voltage to be imparted to at least one filamentary structure deposited in another portion of the nanoporous membrane.

21. A component according to claim 19, lying on a substrate and including at least one filamentary nanoscale structure extending parallel to the plane of the substrate.

22. A component according to claim 19, including an electrode itself having an extension in a pore of the nanoporous membrane.

23. A component according to claim 19, in which at least one filamentary nanoscale structure is a carbon nanotube.

24. A component according to claim 19, in which at least one filamentary nanoscale structure is a rod or a wire.

* * * * *